(12) United States Patent
Ohido

(10) Patent No.: US 7,695,562 B2
(45) Date of Patent: *Apr. 13, 2010

(54) MAGNETIC GARNET SINGLE CRYSTAL AND METHOD FOR PRODUCING THE SAME AS WELL AS OPTICAL ELEMENT USING THE SAME

(75) Inventor: Atsushi Ohido, Tokyo (JP)

(73) Assignee: TDK Corporation, Tokyo (JP)

( * ) Notice: Subject to any disclaimer, the term of this patent is extended or adjusted under 35 U.S.C. 154(b) by 217 days.

This patent is subject to a terminal disclaimer.

(21) Appl. No.: 11/647,431

(22) Filed: Dec. 29, 2006

(65) Prior Publication Data

US 2007/0160875 A1    Jul. 12, 2007

(30) Foreign Application Priority Data

| Jan. 10, 2006 | (JP) | 2006-002380 |
| Feb. 7, 2006 | (JP) | 2006-029339 |
| Nov. 21, 2006 | (JP) | 2006-314086 |

(51) Int. Cl.
*C30B 29/28* (2006.01)

(52) U.S. Cl. .............. 117/54; 117/50; 117/75; 117/76

(58) Field of Classification Search .......... 117/45, 117/50, 54, 75, 76
See application file for complete search history.

(56) References Cited

U.S. PATENT DOCUMENTS

| 4,077,832 | A | 3/1978 | Robertson et al. |
| 4,698,820 | A | 10/1987 | Brandle et al. |
| 6,059,878 | A | 5/2000 | Takeda et al. |
| 7,133,189 | B2 | 11/2006 | Ohido et al. |
| 2003/0219261 | A1 | 11/2003 | Ohido et al. |
| 2007/0160875 | A1 | 7/2007 | Ohido |
| 2007/0193504 | A1 | 8/2007 | Ohido |
| 2008/0095686 | A1 | 4/2008 | Ohido |

FOREIGN PATENT DOCUMENTS

| CN | 1439749 A | 9/2003 |
| DE | 2 318 798 | 10/1973 |
| EP | 0 208 476 A2 | 1/1987 |

(Continued)

OTHER PUBLICATIONS

Park et al.; "Growth of epitaxial garnet film by LPE for application to integrated magneto-optic light for switch arrays;" *Phys. Stat. Sol. (a)*; vol. 201, No. 8; 2004; pp. 1976-1979.

(Continued)

*Primary Examiner*—Robert M Kunemund
(74) *Attorney, Agent, or Firm*—Oliff & Berridge, PLC

(57) ABSTRACT

It is an object of the present invention to provide a magnetic garnet single crystal at a reduced Pb content, and a method for producing the same and an optical element using the same. The object is attained with a magnetic garnet single crystal represented by the chemical formula $Bi_\alpha Na_\beta M1_{3-\alpha-\beta} Fe_{5-\gamma} M2_\gamma O_{12}$ (M1 is at least one element selected from Y, La, Ce, Pr, Nd, Sm, Eu, Gd, Tb, Dy, Ho, Er, Tm, Yb and Lu; and M2 is at least one element selected from Si, Ge and Ti, provided that $0.5 < \alpha \leq 2.0$, $0 < \beta \leq 0.8$, $0.2 \leq 3-\alpha-\beta < 2.5$, and $0 < \gamma \leq 1.6$).

14 Claims, 4 Drawing Sheets

FOREIGN PATENT DOCUMENTS

| | | |
|---|---|---|
| JP | B2-57-045719 | 9/1982 |
| JP | B2-06-046604 | 6/1994 |
| JP | A-9-202697 | 8/1997 |
| JP | A-10-72296 | 3/1998 |
| JP | A-2000-86396 | 3/2000 |
| JP | A-2001-044026 | 2/2001 |
| JP | A-2001-044027 | 2/2001 |
| JP | A-2004-26305 | 1/2004 |
| JP | A-2004-083390 | 3/2004 |
| JP | A-2004-269305 | 9/2004 |
| JP | A-2006-169093 | 6/2006 |
| WO | WO 2006/054628 A1 | 5/2006 |

OTHER PUBLICATIONS

Robertson, J.M.; "Improvement of Lead-Free Flux Systems for the Growth of Bismuth-Substituted Iron Garnet Films by Liquid Phase Epitaxy;" *Journal of the Electrochemical Society*; vol. 123, No. 8; Aug. 1976; pp. 1248-1249.

Nov. 17, 2009 Final Office Action issued in U.S. Appl. No. 11/666,331.

| | Element M2 | Blend material M2/Fe molar ratio | Garnet single crystal | | Faraday rotator |
|---|---|---|---|---|---|
| | | | Na amount $\beta$ | M2 amount $\gamma$ | Optical loss (dB) |
| Example 1-1 | Ge | 0.006 | 0.005 | 0.010 | 0~0.01 |
| Example 1-2 | Ge | 0.004 | 0.004 | 0.007 | 0~0.01 |
| Example 1-3 | Ge | 0.008 | 0.007 | 0.013 | 0~0.01 |
| Example 1-4 | Ge | 0.012 | 0.010 | 0.020 | 0~0.01 |
| Example 1-5 | Ge | 0.020 | 0.017 | 0.033 | 0~0.01 |
| Example 1-6 | Ge | 0.002 | 0.002 | 0.003 | 0.2~0.25 |
| Example 1-7 | Ge | 0.003 | 0.003 | 0.006 | 0.04~0.07 |
| Example 1-8 | Si | 0.006 | 0.005 | 0.010 | 0~0.01 |
| Example 1-9 | Ti | 0.006 | 0.005 | 0.010 | 0~0.01 |
| Example 1-10 | Pt | 0.006 | 0.005 | 0.010 | 0~0.01 |
| Comparative Example 1-1 | – | – | 0.002 | – | 3.0~3.5 |

FIG. 2

| | Element | Blend material | Garnet single crystal | | Faraday rotator |
|---|---|---|---|---|---|
| | M2+M3 | (M2+M3)/Fe molar ratio | Na amount $\beta$ | (M2+M3) amount $\gamma + \delta$ | Optical loss (dB) |
| Example 2-1 | Ge, Si | 0.006 | 0.005 | 0.010 | 0~0.01 |
| Example 2-2 | Ge, Si | 0.004 | 0.004 | 0.007 | 0~0.01 |
| Example 2-3 | Ge, Si | 0.008 | 0.007 | 0.013 | 0~0.01 |
| Example 2-4 | Ge, Si | 0.012 | 0.010 | 0.020 | 0~0.01 |
| Example 2-5 | Ge, Si | 0.020 | 0.017 | 0.033 | 0~0.01 |
| Example 2-6 | Ge, Si | 0.060 | 0.050 | 0.100 | 0~0.01 |
| Example 2-7 | Ge, Si | 0.120 | 0.100 | 0.200 | 0~0.01 |
| Example 2-8 | Ge, Si | 0.002 | 0.002 | 0.003 | 0.2~0.25 |
| Example 2-9 | Si | 0.006 | 0.005 | 0.010 | 0~0.01 |
| Example 2-10 | Ge | 0.006 | 0.005 | 0.010 | 0~0.01 |
| Example 2-11 | Ti | 0.006 | 0.005 | 0.010 | 0~0.01 |
| Example 2-12 | Pt | 0.006 | 0.005 | 0.010 | 0~0.01 |
| Comparative Example 2-1 | - | - | - | - | 3.0~3.5 |
| Comparative Example 2-2 | Pt | 0.100 | 0.080 | 0.160 | - |

FIG. 3

| | Magnetic garnet single crystals | | | | | | | | | Faraday rotator |
|---|---|---|---|---|---|---|---|---|---|---|
| | Na amount β | M4 | M4 amount κ | M5 | M5 amount λ | M6 | M6 amount μ | κ+λ+μ | κ+2λ+3μ | Optical loss (dB) |
| Example 3-1 | 0.005 | Sn | 0.010 | | | | | 0.010 | 0.010 | 0~0.01 |
| Example 3-2 | 0.004 | Sn | 0.007 | | | | | 0.007 | 0.007 | 0~0.01 |
| Example 3-3 | 0.007 | Sn | 0.013 | | | | | 0.013 | 0.013 | 0~0.01 |
| Example 3-4 | 0.010 | Sn | 0.020 | | | | | 0.020 | 0.020 | 0~0.01 |
| Example 3-5 | 0.017 | Sn | 0.033 | | | | | 0.033 | 0.033 | 0~0.01 |
| Example 3-6 | 0.002 | Sn | 0.003 | | | | | 0.003 | 0.003 | 0.2~0.25 |
| Example 3-7 | 0.003 | Sn | 0.006 | | | | | 0.006 | 0.006 | 0.04~0.07 |
| Example 3-8 | 0.005 | Rh | 0.010 | | | | | 0.010 | 0.010 | 0~0.01 |
| Example 3-9 | 0.005 | Ru | 0.010 | | | | | 0.010 | 0.010 | 0~0.01 |
| Example 3-10 | 0.005 | Hf | 0.010 | | | | | 0.010 | 0.010 | 0~0.01 |
| Example 3-11 | 0.005 | Zr | 0.010 | | | | | 0.010 | 0.010 | 0~0.01 |
| Example 3-12 | 0.005 | | | V | 0.005 | | | 0.005 | 0.010 | 0~0.01 |
| Example 3-13 | 0.005 | | | Sb | 0.005 | | | 0.005 | 0.010 | 0~0.01 |
| Example 3-14 | 0.005 | | | Nb | 0.005 | | | 0.005 | 0.010 | 0~0.01 |
| Example 3-15 | 0.005 | | | Ta | 0.005 | | | 0.005 | 0.010 | 0~0.01 |
| Example 3-16 | 0.005 | | | | | W | 0.003 | 0.003 | 0.009 | 0~0.01 |
| Example 3-17 | 0.005 | | | | | Mo | 0.003 | 0.003 | 0.009 | 0~0.01 |
| Comparative Example 3-1 | 0.002 | | | | | | | 0.000 | 0.000 | 3.0~3.5 |

FIG. 4

MAGNETIC GARNET SINGLE CRYSTAL AND METHOD FOR PRODUCING THE SAME AS WELL AS OPTICAL ELEMENT USING THE SAME

BACKGROUND OF THE INVENTION

1. Field of the Invention

The present invention relates to a magnetic garnet single crystal and a method for producing the same as well as an optical element using the same.

2. Description of the Related Art

Faraday rotator is an optical element with a function to rotate the polarization plane of transmitting light and is used in optical devices such as optical isolator, optical attenuator, optical circulator and photo-magnetic field sensor for communication. Faraday rotator is generally prepared by using a plane-like bismuth (Bi)-substituted rare-earth iron garnet single crystal. The Bi-substituted rare-earth iron garnet single crystal is grown by the liquid phase epitaxial (LPE) process as one of flux processes. Single crystals are grown at atmospheric pressure by the flux processes.

In growing the Bi-substituted rare-earth iron garnet single crystal by the solution process (the LPE process) such as flux processes, generally, lead oxide (PbO), bismuth oxide ($Bi_2O_3$) and boron oxide ($B_2O_3$) are used as the solvents so as to stably grow such garnet single crystal while the solvents are maintained at their supersaturation states. During the growth of the magnetic garnet single crystal, therefore, a small amount of lead (Pb) contaminates in the resulting crystal. In Faraday rotators for use in optical devices for communication, magnetic garnet single crystals at a Pb content "y" of about 0.03 to 0.06 in the chemical formula $Bi_{3-x-y}M11_xPb_yFe_{5-z-w}M12_zM13_wO_{12}$ have been used conventionally. See Patent Reference 1: JP-A-2001-044026; Patent Reference 2: JP-A-2001-044027; and Patent Reference 3: JP-B-6-046604.

Following the upsurge in the recent environmental protection movement, however, efforts are now directed toward the reduction of the content of Pb as an environmental load substance in any of industrial products. Therefore, a trace amount of contaminating Pb in magnetic garnet single crystals grown by the LPE process draws concerns as a factor of environmental pollution. Therefore, it is necessary to reduce or eliminate the amount of Pb contained in magnetic garnet single crystals as materials constituting Faraday rotators.

SUMMARY OF THE INVENTION

It is an object of the present invention to provide a magnetic garnet single crystal at a reduced Pb content, and a method for producing the same and an optical element using the same.

The object is attained with a magnetic garnet single crystal represented by the chemical formula $Bi_\alpha Na_\beta M1_{3-\alpha-\beta}Fe_{5-\gamma}M2_\gamma O_{12}$ (M1 is at least one element selected from Y, La, Ce, Pr, Nd, Sm, Eu, Gd, Tb, Dy, Ho, Er, Tm, Yb and Lu; and M2 is at least one element selected from Si, Ge and Ti, provided that $0.5<\alpha\leq 2.0$, $0<\beta\leq 0.8$, $0.2\leq 3-\alpha-\beta<2.5$, and $0<\gamma\leq 1.6$).

The magnetic garnet single crystal in accordance with the invention is characteristic in that the "γ" is under the provision of $0.007\leq\gamma\leq 1.6$.

The object is attained with an optical element prepared by using the magnetic garnet single crystal in accordance with the invention.

Furthermore, the object is attained by a method for producing the magnetic garnet single crystal comprising preparing a melt from a material containing Na, Fe, M1 and M2 (M1 is at least one element selected from Y, La, Ce, Pr, Nd, Sm, Eu, Gd, Tb, Dy, Ho, Er, Tm, Yb and Lu, while M2 is at least one element selected from Si, Ge and Ti), and growing the magnetic garnet single crystal using the melt.

The method for producing the magnetic garnet single crystal is characteristic in that the molar ratio of the M2 to Fe in the material is 0.004 or more.

The magnetic garnet single crystal in accordance with the invention is characteristic in that the β and the γ are under the provisions of $0<\beta\leq 0.1$, and $0<\gamma\leq 0.2$. Further, the magnetic garnet single crystal in accordance with the invention is characteristic in that the β and the γ are under the provisions of $0<\beta\leq 0.05$ and $0<\gamma\leq 0.1$. Still further, the magnetic garnet single crystal in accordance with the invention is characteristic in that the M2 is one or more elements including at least Si.

The object described above is attained by a magnetic garnet single crystal represented by the chemical formula $Bi_\alpha Na_\beta M1_{3-\alpha-\beta}Fe_{5-\gamma-\delta}M2_\gamma M3_\delta O_{12}$ (M1 is at least one element selected from Y, La, Ce, Pr, Nd, Sm, Eu, Gd, Tb, Dy, Ho, Er, Tm, Yb and Lu; M2 is at least one element selected from Si, Ge and Ti; and M3 is Pt, provided that $0.5<\alpha\leq 2.0$, $0<\beta\leq 0.8$, $0.2\leq 3-\alpha-\beta<2.5$, $0<\gamma+\delta\leq 1.6$, $0\leq\gamma<1.6$, and $0<\delta<0.16$).

The object is attained by a Faraday rotator prepared with the magnetic garnet single crystal of the invention.

The object is attained by a magnetic garnet single crystal represented by the chemical formula $Bi_\alpha Na_\beta M1_{3-\alpha-\beta}Fe_{5-\kappa-\lambda-\mu}M4_\kappa M5_\lambda M6_\mu O_{12}$ (M1 is at least one element selected from Y, La, Ce, Pr, Nd, Sm, Eu, Gd, Tb, Dy, Ho, Er, Tm, Yb and Lu; M4 is at least one element selected from Sn, Rh, Ru, Hf and Zr; M5 is at least one element selected from V, Sb, Nb and Ta; and M6 is at least one element selected from W and Mo, provided that $0.5\leq\alpha\leq 2.0$, $0<\beta\leq 2.4$, $0<3-\alpha-\beta<2.5$, and $0<\kappa+\lambda+\mu\leq 1.6$).

The magnetic garnet single crystal of the invention is characteristic in that the "κ", the "λ" and the "μ" satisfy the relation of $\kappa+2\lambda+3\mu\leq 0.007$.

The object is attained by an optical element prepared by using the magnetic garnet single crystal of the invention.

In accordance with the invention, the Pb content in the magnetic garnet single crystal can be reduced or completely eliminated.

BRIEF DESCRIPTION OF THE DRAWINGS

FIG. 2 shows a table collectively showing the M2/Fe molar ratios, the Na amount "β", the M2 amount "γ", and the optical loss in Examples 1-1 through 1-10 and Comparative Example 1-1 in the first mode for carrying out the invention;

FIG. 3 shows a table collectively showing the (M2+M3)/Fe molar ratios, the Na amount "β", the (M2+M3) amount namely (γ+δ), and the optical loss in Examples 2-1 through 2-12 and Comparative Examples 2-1 and 2-2 in the second mode for carrying out the invention; and FIG. 4 shows a table collectively showing the Na amount "β", the M4 amount "κ", the M5 amount "λ", the M6 amount "μ", and the optical loss of the resulting Faraday rotators in Examples 3-1 through 3-17 and Comparative Example 3-1 in the third mode for carrying out the invention.

DESCRIPTION OF THE PREFERRED EMBODIMENTS

Figure 1:
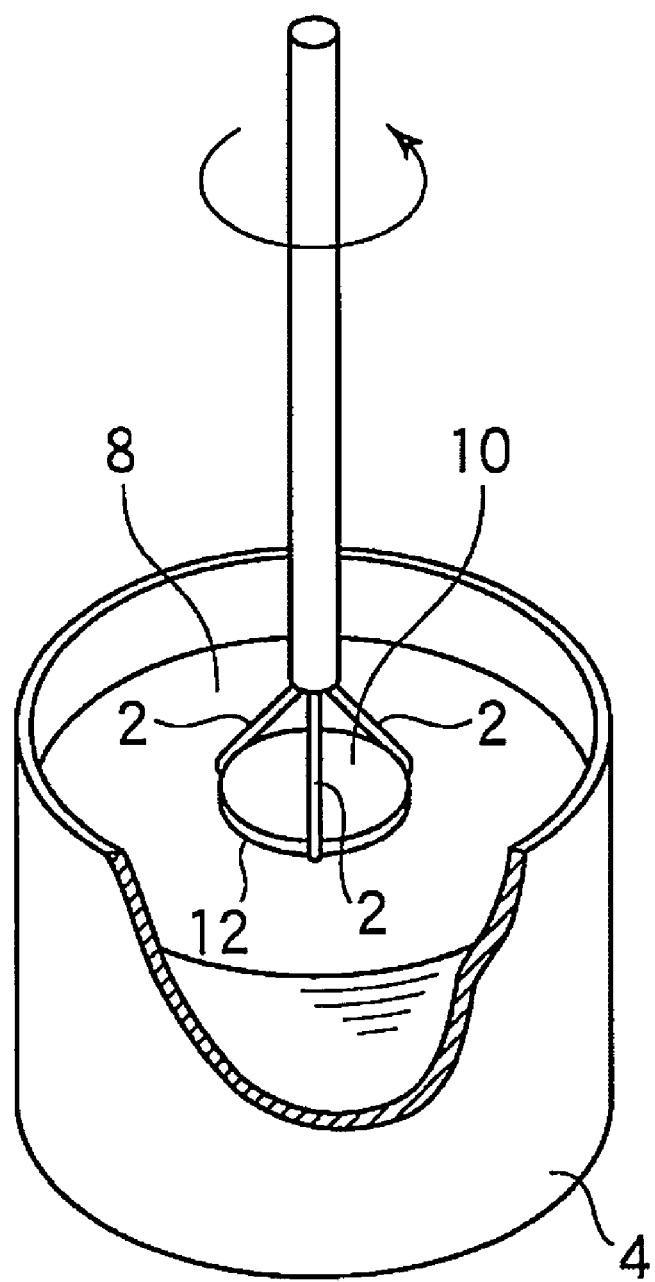
FIG. 1 is a view depicting a part of the single crystal growing process.

First Mode for Carrying out the Invention

A magnetic garnet single crystal, and a method for producing the same and an optical element using the same, in accordance with a first mode for carrying out the invention, are now described in FIGS. 1 and 2. In the present mode, a magnetic garnet single crystal is grown in solvents containing sodium (Na) and iron (Fe) after Pb contained in conventional solvents is replaced with Na. Compared with other oxides, a great number of substances containing Na and oxygen are dissolved at lower temperatures. Therefore, such substances are effective as solvents for growing magnetic garnet single crystals. A magnetic garnet single crystal grown in a solvent containing for example sodium hydroxide (NaOH) is of an excellent quality without any defects or cracks. By removing PbO from a solvent material and using a Na-containing substance together with $Bi_2O_3$ and $B_2O_3$ as a solvent, a trace amount of Pb contained in conventional magnetic garnet single crystals can almost completely be removed.

It was demonstrated that the garnet single crystal grown in Na-containing solvents had very high optical absorption in a wavelength band region of 1300 to 1600 nm for use in optical communication. When garnet single crystals with such high optical absorption are processed to prepare an optical element such as Faraday rotator, disadvantageously, the optical loss (insertion loss) in the resulting optical element is elevated. So as to reduce the optical loss of an optical element from which Pb has preliminarily been removed almost completely, therefore, it is necessary to reduce the optical absorption of garnet single crystals grown with solvents containing Na.

Herein, a Faraday rotator was prepared by processing a $(BiGdYb)_3Fe_5O_{12}$ single crystal grown in a solvent containing NaOH, $Bi_2O_3$ and $B_2O_3$ by the LPE process. The optical loss of the Faraday rotator against the beam at a wavelength of 1.55 μm was 3 dB. Another Faraday rotator was prepared by processing a $(BiGdYb)_3Fe_5O_{12}$ single crystal grown in a solvent containing Pb by the LPE process. The optical loss of the Faraday rotator against the beam at a wavelength of 1.55 μm was 0.05 dB or less. It was now shown that the optical loss of the Faraday rotator prepared by using the Na-containing solvent was extremely high compared with the optical loss of the Faraday rotator prepared by using the Pb-containing solvent. The compositions were examined by X-ray fluorescence analysis. Na at about 100 to 300 ppm was detected in the garnet single crystal grown in the Na-containing solvent. The cation (positive ion) constituting the Bi-substituted rare-earth iron garnet is essentially trivalent. When the Na cation with a stable valence number of monovalence enters in a garnet single crystal, the charge balance is deteriorated so that the resulting garnet single crystal turns a semiconductor. This indicates the occurrence of optical absorption in the Na-containing garnet single crystal.

In this mode, at least one of silicone oxide ($SiO_2$), germanium oxide ($GeO_2$), titanium oxide ($TiO_2$) and platinum oxide ($PtO_2$) was added together with Na to a blend material, to grow a garnet single crystal. The grown garnet single crystal was processed into a Faraday rotator and then evaluated the optical loss. It was found that the optical loss was likely reduced. It is suggested that because tetravalent cations of Si, Ge, Ti and Pt are so stable in garnet to compensate the monovalent Na cation contained in garnet, the charge in the garnet single crystal is balanced well.

In the mode, various amounts of $GeO_2$ were added to a Na-containing blend material, to grow plural types of garnet single crystals. Using the molar ratio of Ge to Fe in the blend material (Ge/Fe molar ratio) as a parameter, the Ge/Fe molar ratio was preset at various values within a range of 0 to 0.02. The grown garnet single crystals of plural types were individually processed into Faraday rotators, to evaluate the optical loss. Consequently, even a trace amount of $GeO_2$ added to the blend material greatly reduced the optical loss of the resulting Faraday rotators. The optical loss of a Faraday rotator prepared by using a blend material at a Ge/Fe molar ratio of 0.004 was as small as 0 to 0.01 dB. Even when the Ge/Fe molar ratio was increased to more than 0.004, the optical loss of the resulting Faraday rotator was 0 to 0.01 dB, without any change.

The composition of the garnet single crystal grown from a blend material at a Ge/Fe molar ratio of 0.004 was analyzed by X-ray fluorescence analysis and ICP (inductively coupled plasma; high-frequency inductively coupled plasma) analysis. The chemical formula $(BiGdYb)_{2.996}Na_{0.004}Fe_{4.993}Ge_{0.007}O_{12}$ was obtained. Thus, the introduction of an element stable at its tetravalent state in garnet, such as Ge, into the garnet single crystal reduced the optical loss of the resulting Faraday rotator. It was found that when the Ge amount in a garnet single crystal was adjusted to 0.007 in the chemical formula, the optical loss of the resulting Faraday rotator could be made at minimum. Even when the Ge amount in the garnet single crystal was further elevated, the optical loss of the Faraday rotator remained at the minimum.

It was shown that under the same conditions as described above, elements stable at a tetravalent state in garnet such as Si, Ti and Pt other than Ge could reduce the optical loss of the resulting Faraday rotators. Additionally, it was found that two or more of Ge, Si, Ti and Pt when used in combination could reduce the optical loss of the resulting Faraday rotators under the same conditions. A Faraday rotator with less optical loss can be obtained by using a garnet single crystal grown with a blend material containing Na, Fe and Me (M2 is at least one element selected from Si, Ge, Ti and Pt). Further, a Faraday rotator with far less optical loss can be obtained by using a garnet single crystal grown with a blend material at a molar ratio of M2 to Fe (M2/Fe molar ratio) of 0.004 or more.

Techniques for reducing optical loss via charge compensation between an element stable at a tetravalent state in garnet such as Si, Ge, Ti and Pt, and Pb entering at the bivalent state in garnet have been known traditionally (see for example Patent References 1 through 3). However, the optical loss of a Faraday rotator prepared with a garnet single crystal involving charge compensation between Pb and at least one element selected from Si, Ge, Ti and Pt is about 0.01 to 0.05 dB. In contrast, the optical loss of a Faraday rotator prepared with a garnet single crystal involving charge compensation between Na and at least one element selected from Si, Ge, Ti and Pt is about 0 to 0.01 dB. In this mode, accordingly, it is shown that more excellent properties with smaller optical loss than the optical loss of conventional Faraday rotators containing Pb were obtained. This may be ascribed to more complete charge compensation with the combination of Na with Si, Ge, Ti and Pt.

When Si, Ge, Ti and Pt enter at a given amount or more in a garnet single crystal to deteriorate the charge balance, Na enters in the garnet so that the charge may be compensated. Even in case of the substitution of a large amount of Fe with Si, Ge, Ti and Pt, the introduction of Na into garnet compensates the charge. When the amount of Si, Ge, Ti and Pt in substitution exceeds 1.6 in a magnetic garnet single crystal, the Curie point is lowered down to around ambient temperature, so that the resulting product is hardly used as a Faraday rotator. Thus, the upper limit of the amount of Si, Ge, Ti and Pt in substitution is 1.6 in the chemical formula. When an element stable at a tetravalent state and an element stable at a monovalent state enter at a ratio of 1:2 in garnet, the charge is well balanced. When Si, Ge, Ti and Pt enter just at 1.6 in the chemical formula in garnet, therefore, Na enters just at 0.8 in the chemical formula. In other words, the upper limit of Na contained in the magnetic garnet single crystal usable in Faraday rotators is 0.8 in the chemical formula.

In case of growing a magnetic garnet single crystal in a solvent containing Na, the solution can be retained at its supersaturation state stably, compared with a solvent never containing Na. Therefore, Bi up to about 2.0 in the chemical formula can enter stably in the garnet single crystal. So as to obtain a sufficient rotation coefficient (deg/μm) as a Faraday rotator, meanwhile, Bi at 0.5 or more in the chemical formula is required.

In this mode, furthermore, the following elements capable of stably forming garnet single crystals with Fe singly or in combination with them are used as rare-earth elements to be contained in magnetic garnet single crystals: yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

As described above, the magnetic garnet single crystal in the mode for carrying out the invention is represented by the chemical formula $Bi_\alpha Na_\beta M1_{3-\alpha-\beta} Fe_{5-\gamma} M2_\gamma O_{12}$ (M1 is at least one element selected from Y, La, Ce, Pr, Nd, Sm, Eu, Gd, Tb, Dy, Ho, Er, Tm, Yb and Lu; and M2 is at least one element selected from Si, Ge, Ti and Pt provided that $0.5<\alpha\leq2.0$, $0<\beta\leq0.8$, $0.2\leq3-\alpha-\beta<2.5$, and $0<\gamma\leq1.6$). According to this mode, a magnetic garnet single crystal from which Pb is preliminarily removed almost completely as well as an optical element using the same can be realized. According to this mode for carrying out the invention, the optical loss of the resulting optical element can be reduced.

The magnetic garnet single crystal, and the method for producing the same and the optical element using the same in accordance with this mode are more specifically described below, using Examples and Comparative Examples.

EXAMPLE 1-1

FIG. 1 partially depicts the process of growing a magnetic garnet single crystal. First, $Gd_2O_3$, $Yb_2O_3$, $Fe_2O_3$, $GeO_2$, $B_2O_3$, $Bi_2O_3$, and NaOH were charged in a gold (Au) crucible 4, which was arranged in an electric furnace. The Ge/Fe molar ratio then was 0.006. By dissolving the materials in the crucible 4 by raising the furnace temperature to 950° C., a melt 8 was generated and agitated with an agitation device made of Au. As a substrate for growing a magnetic garnet single crystal thereon from the melt 8, a single crystal wafer prepared from an ingot of a garnet single crystal grown by the pulling method is used. In this Example, a CaMgZr-substituted GGG (gadolinium.gallium.garnet) single crystal substrate $((GdCa)_3(GaMgZr)_5O_{12})$ is used as the substrate 10 for growing the single crystal.

Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours.

A magnetic garnet single crystal film 12 of a film thickness of 500 μm was obtained. The grown single crystal film 12 was compositionally analyzed by X-ray fluorescence analysis. The composition was $Bi_{1.300}Gd_{1.200}Yb_{0.500}Fe_{4.990}Ge_{0.010}O_{12}$, with no Na detected. The composition was examined in detail by the ICP analysis, with the Na content determined. Consequently, it was shown that the chemical formula of the magnetic garnet single crystal film 12 was $(BiGdYb)_{2.995}Na_{0.005}(FeGe)_{5.000}O_{12}$. By processing the grown single crystal film 12, a single crystal plate with a rotation angle of 45 deg toward the beam at a wavelength of 1.55 μm was prepared. A non-reflective film was formed on the polished face of the resulting single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 1-2

$Gd_2O_3$, $Yb_2O_3$, $Fe_2O_3$, $GeO_2$, $B_2O_3$, $Bi_2O_3$, and NaOH were charged in a crucible 4 made of Au, which was arranged in an electric furnace. The Ge/Fe molar ratio then was 0.004. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.300}Gd_{1.200}Yb_{0.005}Fe_{4.993}Ge_{0.007}O_{12}$, with no Na detected. The composition was examined in detail by the ICP analysis. The Na content could be determined. Consequently, it was shown that the chemical formula of the magnetic garnet single crystal film 12 was $(BiGdYb)_{2.996}Na_{0.004}(FeGe)_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 1-3

$Gd_2O_3$, $Yb_2O_3$, $Fe_2O_3$, $GeO_2$, $B_2O_3$, $Bi_2O_3$, and NaOH were charged in a crucible 4 made of Au, which was arranged in an electric furnace. The Ge/Fe molar ratio then was 0.008. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis, with Na detected. The composition was $Bi_{1.293}Gd_{1.200}Yb_{0.500}Na_{0.007}Fe_{4.987}Ge_{0.013}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 1-4

$Gd_2O_3$, $Yb_2O_3$, $Fe_2O_3$, $GeO_2$, $B_2O_3$, $Bi_2O_3$, and NaOH were charged in a crucible 4 made of Au, which was arranged in an electric furnace. The Ge/Fe molar ratio then was 0.012. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.290}Gd_{1.200}Yb_{0.500}Na_{0.010}Fe_{4.980}Ge_{0.020}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 1-5

$Gd_2O_3$, $Yb_2O_3$, $Fe_2O_3$, $GeO_2$, $B_2O_3$, $Bi_2O_3$, and NaOH were charged in a crucible 4 made of Au, which was arranged in an electric furnace. The Ge/Fe molar ratio then was 0.020. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.283}Gd_{1.200}Yb_{0.0500}Na_{0.017}Fe_{4.967}Ge_{0.033}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 1-6

$Gd_2O_3$, $Yb_2O_3$, $Fe_2O_3$, $GeO_2$, $B_2O_3$, $Bi_2O_3$, and NaOH were charged in a crucible 4 made of Au, which was arranged in an electric furnace. The Ge/Fe molar ratio then was 0.002. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.300}Gd_{1.200}Yb_{0.500}Fe_{4.997}Ge_{0.003}O_{12}$, with no Na detected. Then, the composition was examined in detail by the ICP analysis. The Na content could be determined. Consequently, it was shown that the chemical formula of the magnetic garnet single crystal 12 was $(BiGdYb)_{2.998}Na_{0.002}(FeGe)_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 0.2 to 0.25 dB.

EXAMPLE 1-7

$Gd_2O_3$, $Yb_2O_3$, $Fe_2O_3$, $GeO_2$, $B_2O_3$, $Bi_2O_3$, and NaOH were charged in a crucible 4 made of Au, which was arranged in an electric furnace. The Ge/Fe molar ratio then was 0.003. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.300}Gd_{1.200}Yb_{0.500}Fe_{4.994}Ge_{0.006}O_{12}$, with no Na detected. Then, the composition was examined in detail by the ICP analysis. The Na content could be determined. Consequently, it was shown that the chemical formula of the magnetic garnet single crystal 12 was $(BiGdYb)_{2.997}Na_{0.003}(FeGe)_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 0.04 to 0.07 dB.

EXAMPLE 1-8

$Gd_2O_3$, $Yb_2O_3$, $Fe_2O_3$, $SiO_2$, $B_2O_3$, $Bi_2O_3$, and NaOH were charged in a crucible 4 made of Au, which was arranged in an electric furnace. The Si/Fe molar ratio then was 0.006. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.300}Gd_{1.200}Yb_{0.500}Fe_{4.990}Si_{0.010}O_{12}$, with no Na detected. The composition was examined in detail by the ICP analysis. The Na content could be determined. Consequently, it was shown that the chemical formula of the magnetic garnet single crystal 12 was $(BiGdYb)_{2.995}Na_{0.005}(FeSi)_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 1-9

$Gd_2O_3$, $Yb_2O_3$, $Fe_2O_3$, $TiO_2$, $B_2O_3$, $Bi_2O_3$, and NaOH were charged in a crucible 4 made of Au, which was arranged in an electric furnace. The Ti/Fe molar ratio then was 0.006. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.300}Gd_{1.200}Yb_{0.500}Fe_{4.990}Ti_{0.010}O_{12}$, with no Na detected. The composition was examined in detail by the ICP analysis. The Na content could be determined. Consequently, it was shown that the chemical formula of the magnetic garnet single crystal 12 was $(BiGdYb)_{2.995}Na_{0.005}(FeTi)_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 1-10

$Gd_2O_3$, $Yb_2O_3$, $Fe_2O_3$, $PtO_2$, $B_2O_3$, $Bi_2O_3$, and NaOH were charged in a crucible 4 made of Au, which was arranged in an electric furnace. The Pt/Fe molar ratio then was 0.006. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.300}Gd_{1.200}Yb_{0.500}Fe_{4.990}Pt_{0.010}O_{12}$, with no Na detected. The composition was examined in detail by the ICP analysis. The Na content could be determined. Consequently, it was shown that the chemical formula of the magnetic garnet single crystal 12 was $(BiGdYb)_{2.995}Na_{0.005}(FePt)_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

Comparative Example 1-1

$Gd_2O_3$, $Yb_2O_3$, $Fe_2O_3$, $B_2O_3$, $Bi_2O_3$, and NaOH were charged in a crucible 4 made of Au, which was arranged in an electric furnace. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.300}Gd_{1.200}Yb_{0.500}Fe_{5.000}O_{12}$, with no Na detected. The composition was examined in detail by the ICP analysis. The Na content could be determined. Consequently, it was shown that the chemical formula of the magnetic garnet single crystal 12 was $(BiGdYb)_{2.998}Na_{0.002}Fe_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. 20 samples were taken out of the prepared Faraday rotator to evaluate the optical loss against the beam at a wavelength of 1.55 μm. The optical loss of the Faraday rotator was 3.0 to 3.5 dB, which was very large optical loss.

FIG. 2 collectively depicts the M2/Fe molar ratios in the blend materials, the Na amount "β" and the M2 amount "γ" in the grown garnet single crystals, and the optical loss (dB) of the prepared Faraday rotators in the Examples and the Comparative Example. As shown in FIG. 2, the Faraday rotators (Examples 1-1 through 1-10) using the magnetic garnet single crystals containing Na and M2 can have reduced optical loss compared with the Faraday rotator (Comparative Example 1-1) using the magnetic garnet single crystal containing Na but never containing M2. In case that the M2 amount "γ" in the magnetic garnet single crystals is 0.007 or more (Examples 1-1 through 1-5 and Examples 1-8 through 1-10), the resulting Faraday rotators with extremely small optical loss can be obtained, compared with a conventional Faraday rotator prepared by using a magnetic garnet single crystal grown in a solvent containing Pb (for example with the optical loss of 0.05 dB or less).

By using the magnetic garnet single crystals grown from a material containing Na, Fe, M1 and M2, additionally, a Faraday rotator with small optical loss can be obtained, as indicated. In case that the M2/Fe molar ratio is 0.004 or more, in particular, a Faraday rotator with extremely small optical loss can be obtained.

Second Mode for Carrying out the Invention

In accordance with a second mode for carrying out the invention, a magnetic garnet single crystal, and a method for producing the same and an optical element using the same are described below with reference to FIGS. 1 and 3. Na is an element with a larger ion radius compared with rare earth elements and Bi, and Na occupies the same site in the garnet crystal structure as rare earth elements and Bi occupy. So as to prevent the occurrence of single crystal cracking in growing a garnet film, the lattice constants of a substrate and the film should be almost equal. So as to retain the lattice constants at a given value even when Na enters in garnet, essentially, the amounts of elements with relatively larger ion radii, such as Bi, Gd and Tb are reduced, while the amounts of elements with relatively small ion radii, such as Yb, Ho and Y are raised. While Bi gives a large influence on the thickness of the rotator, Gd, Tb and the like influence the saturation magnetic field of the rotator. So as to retain the lattice constants at a given value even when the Na amount in garnet is elevated, the composition of rare earth elements and Bi inevitably changes. The characteristic profile including for example the saturation magnetic field and the thickness of the rotator then differs from the profile of conventional such rotators containing Pb. Preferably, the Pb-containing rotators in the related art are replaced with Pb-free rotators having nevertheless the same characteristic properties. Thus, the Na amount "β" is preferably less, and in practical sense, it is required that the Na amount "β" is at least 0.1 or less. So as to allow such Pb-free rotators to have characteristic properties as close as possible to those of the rotators in the related art, the Na amount "β" is more preferably 0.05 or less. Among Si, Ge and Ti, Si is of a smaller ionic radius and effectively reduces the effect of Na with a larger ionic radius entering in garnet when Si is added to garnet. Accordingly, preferably, Si is added to garnet to compensate the charge. Like Si, Ge and Ti, Pt compensates the charge together with Na in garnet while Pt is at its tetravalent, cationic stable state, to effectively suppress the optical absorption. However, Pt is an element readily forming a stable complex oxide. When attempts are made to grow a garnet film with the Pt amount "δ" more than 0.16, the deposition of a complex oxide containing Pt occurs together with the growth of the garnet film, so that the solution cannot be retained stably at its supersaturation state. Accordingly, it is difficult to grow a garnet film of a film thickness of several hundreds μm and with less crystal defects, which are necessary to prepare a Faraday rotator. Therefore, the Pt amount "δ" is preferably smaller than 0.16.

The magnetic garnet single crystal, and the method for producing the same and the optical element using the same in accordance with this mode are specifically described below with reference to Examples and Comparative Examples.

EXAMPLE 2-1

$Gd_2O_3$, $Yb_2O_3$, $Fe_2O_3$, $GeO_2$, $SiO_2$, $B_2O_3$, $Bi_2O_3$, and NaOH were charged in a crucible 4 made of Au, which was arranged in an electric furnace. Then, the molar ratio of Ge and Si to Fe ((Ge+Si)/Fe)was 0.006. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film 12 of a film thickness of 500 μm was obtained. The grown single crystal film 12 was compositionally analyzed by X-ray fluorescence analysis. The composition was $Bi_{1.000}Gd_{1.610}Yb_{0.390}Fe_{4.990}Ge_{0.005}Si_{0.005}O_{12}$, with no Na detected. The composition was examined in detail by the ICP analysis. The Na content could be determined. Consequently, it was shown that the chemical formula of the magnetic garnet single crystal 12 was $(BiGdYb)_{2.995}Na_{0.005}(FeGeSi)_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. The thickness of the rotator was 410 μm, while the saturated magnetic field in a 1-mm square shape was 618 Oe. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 2-2

$Gd_2O_3$, $Yb_2O_3$, $Fe_2O_3$, $GeO_2$, $SiO_2$, $B_2O_3$, $Bi_2O_3$, and NaOH were charged in a crucible 4 made of Au, which was arranged in an electric furnace. Then, the molar ratio of Ge and Si to Fe ((Ge+Si)/Fe) was 0.004. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 μm was obtained. The grown single crystal film was compositionally analyzed by X-ray fluorescence analysis. The composition was $Bi_{1.000}Gd_{1.610}Yb_{0.390}(FeGeSi)_{5.000}O_{12}$, but the amounts of Ge and Si were not determined, with no Na detected. The composition was examined in detail by the ICP analysis. The Na content could be determined. Consequently, it was shown that the chemical formula of the magnetic garnet single crystal was $(BiGdYb)_{2.996}Na_{0.004}Fe_{4.993}Ge_{0.004}Si_{0.003}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. The thickness of the rotator was 410 μm, while the saturated magnetic field in a 1-mm square shape was 618 Oe. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 2-3

$Gd_2O_3$, $Yb_2O_3$, $Fe_2O_3$, $GeO_2$, $SiO_2$, $B_2O_3$, $Bi_2O_3$, and NaOH were charged in a crucible 4 made of Au, which was arranged in an electric furnace. Then, the molar ratio of Ge and Si to Fe ((Ge+Si)/Fe) was 0.008. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 μm was obtained. The grown single crystal film was compositionally analyzed by X-ray fluorescence analysis, with Na detected. The composition was $Bi_{0.990}Gd_{1.610}Yb_{0.393}Na_{0.007}Fe_{4.987}Ge_{0.008}Si_{0.005}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. The thickness of the rotator was 413 μm, while the saturated magnetic field in a 1-mm square shape was 618 Oe. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 2-4

$Gd_2O_3$, $Yb_2O_3$, $Fe_2O_3$, $GeO_2$, $SiO_2$, $B_2O_3$, $Bi_2O_3$, and NaOH were charged in a crucible 4 made of Au, which was arranged in an electric furnace. Then, the molar ratio of Ge and Si to Fe ((Ge+Si)/Fe) was 0.012. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 μm was obtained. The grown single crystal film was compositionally analyzed by X-ray fluorescence analysis. The composition was $Bi_{0.986}Gd_{1.610}Yb_{0.394}Na_{0.010}Fe_{4.980}Ge_{0.015}Si_{0.005}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. The thickness of the rotator was 415 μm, while the saturated magnetic field in a 1-mm square shape was 617 Oe. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 2-5

$Gd_2O_3$, $Yb_2O_3$, $Fe_2O_3$, $GeO_2$, $SiO_2$, $B_2O_3$, $Bi_2O_3$, and NaOH were charged in a crucible 4 made of Au, which was arranged in an electric furnace. Then, the molar ratio of Ge and Si to Fe ((Ge+Si)/Fe) was 0.020. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 μm was obtained. The grown single crystal film was compositionally analyzed by X-ray fluorescence analysis. The composition was $Bi_{0.990}Gd_{1.590}Yb_{0.403}Na_{0.017}Fe_{4.967}Ge_{0.028}Si_{0.005}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. The thickness of the rotator was 413 μm, while the saturated magnetic field in a 1-mm square shape was 626 Oe. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 2-6

$Gd_2O_3$, $Yb_2O_3$, $Fe_2O_3$, $GeO_2$, $SiO_2$, $B_2O_3$, $Bi_2O_3$, and NaOH were charged in a crucible 4 made of Au, which was arranged in an electric furnace. Then, the molar ratio of Ge and Si to Fe ((Ge+Si)/Fe) was 0.060. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 μm was obtained. The grown single crystal film was compositionally analyzed by X-ray fluorescence analysis. The composition was $Bi_{0.950}Gd_{1.580}Yb_{0.420}Na_{0.050}Fe_{4.900}Ge_{0.080}Si_{0.020}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. The thickness of the rotator was 431 μm, while the saturated magnetic field in a 1-mm square shape was 631 Oe. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 2-7

$Gd_2O_3$, $Yb_2O_3$, $Fe_2O_3$, $GeO_2$, $SiO_2$, $B_2O_3$, $Bi_2O_3$, and NaOH were charged in a crucible 4 made of Au, which was arranged in an electric furnace. Then, the molar ratio of Ge and Si to Fe ((Ge+Si)/Fe) was 0.120. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 μm was obtained. The grown single crystal film was compositionally analyzed by X-ray fluorescence analysis. The composition was $Bi_{0.923}Gd_{1.510}Yb_{0.467}Na_{0.100}Fe_{4.800}Ge_{0.160}Si_{0.040}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. The thickness of the rotator was 443 μm, while the saturated magnetic field in a 1-mm square shape was 662 Oe. 20 samples were taken out of the prepared Faraday rotator to evaluate the optical loss against the beam at a wavelength of 1.55 µm. The optical loss of the Faraday rotator was 0 to 0.01 dB, which was very small optical loss.

EXAMPLE 2-8

$Gd_2O_3$, $Yb_2O_3$, $Fe_2O_3$, $GeO_2$, $SiO_2$, $B_2O_3$, $Bi_2O_3$, and NaOH were charged in a crucible 4 made of Au, which was arranged in an electric furnace. Then, the molar ratio of Ge and Si to Fe ((Ge+Si)/Fe) was 0.002. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.000}Gd_{1.610}Yb_{0.390}(FeGeSi)_{5.000}O_{12}$, with no Na detected. The composition was examined in detail by the ICP analysis. The Na content could be determined. Consequently, it was shown that the chemical formula of the magnetic garnet single crystal 12 was $(BiGdYb)_{2.998}Na_{0.002}Fe_{4.997}Ge_{0.002}Si_{0.001}O_{12}$. By processing the grown single crystal film 12, a single crystal plate with a rotation angle of 45 deg toward the beam at a wavelength of 1.55 µm was prepared. A non-reflective film was formed on the polished face of the single crystal plate, to prepare a Faraday rotator. The thickness of the rotator was 410 µm, while the saturated magnetic field in a 1-mm square shape was 618 Oe. 20 samples were taken out of the prepared Faraday rotator to evaluate the optical loss against the beam at a wavelength of 1.55 µm. The optical loss of the Faraday rotator was 0.2 to 0.25 dB. The optical loss was smaller than that of a Faraday rotator prepared without addition of Ge.

EXAMPLE 2-9

$Gd_2O_3$, $Yb_2O_3$, $Fe_2O_3$, $SiO_2$, $B_2O_3$, $Bi_2O_3$, and NaOH were charged in a crucible 4 made of Au, which was arranged in an electric furnace. Then, the molar ratio of Si to Fe (Si/Fe) was 0.006. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.000}Gd_{1.520}Yb_{0.480}Fe_{4.990}Si_{0.010}O_{12}$, with no Na detected. Then, the composition was examined in detail by the ICP analysis. The Na content could be determined. Consequently, the chemical formula of the magnetic garnet single crystal was $(BiGdYb)_{2.995}Na_{0.005}(FeSi)_{5.000}O_{12}$. By processing the grown single crystal film 12, a single crystal plate with a rotation angle of 45 deg toward the beam at a wavelength of 1.55 µm was prepared. A non-reflective film was formed on the polished face of the single crystal plate, to prepare a Faraday rotator. The thickness of the rotator was 410 µm, while the saturated magnetic field in a 1-mm square shape was 618 Oe. 20 samples were taken out of the prepared Faraday rotator to evaluate the optical loss against the beam at a wavelength of 1.55 µm. The optical loss of the Faraday rotator was 0 to 0.01 dB, which was very small optical loss.

EXAMPLE 2-10

$Gd_2O_3$, $Yb_2O_3$, $Fe_2O_3$, $GeO_2$, $B_2O_3$, $Bi_2O_3$, and NaOH were charged in a crucible 4 made of Au, which was arranged in an electric furnace. Then, the molar ratio of Ge to Fe (Ge/Fe) was 0.006. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.000}Gd_{1.610}Yb_{0.390}Fe_{4.990}Ge_{0.010}O_{12}$, with no Na detected. Then, the composition was examined in detail by the ICP analysis. The Na content could be determined. Consequently, the chemical formula of the magnetic garnet single crystal was $(BiGdYb)_{2.995}Na_{0.005}(FeGe)_{5.000}O_{12}$. By processing the grown single crystal film 12, a single crystal plate with a rotation angle of 45 deg toward the beam at a wavelength of 1.55 µm was prepared. A non-reflective film was formed on the polished face of the single crystal plate, to prepare a Faraday rotator. The thickness of the rotator was 410 µm, while the saturated magnetic field in a 1-mm square shape was 618 Oe. 20 samples were taken out of the prepared Faraday rotator to evaluate the optical loss against the beam at a wavelength of 1.55 µm. The optical loss of the Faraday rotator was 0 to 0.01 dB, which was very small optical loss.

EXAMPLE 2-11

$Gd_2O_3$, $Yb_2O_3$, $Fe_2O_3$, $TiO_2$, $B_2O_3$, $Bi_2O_3$, and NaOH were charged in a crucible 4 made of Au, which was arranged in an electric furnace. Then, the molar ratio of Ti to Fe (Ti/Fe) was 0.006. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.000}Gd_{1.610}Yb_{0.390}Fe_{4.990}Ti_{0.010}O_{12}$, with no Na detected. Then, the composition was examined in detail by the ICP analysis. The Na content could be determined. Consequently, the chemical formula of the magnetic garnet single crystal was $(BiGdYb)_{2.995}Na_{0.005}(FeTi)_{5.000}O_{12}$. By processing the grown single crystal film 12, a single crystal plate with a rotation angle of 45 deg toward the beam at a wavelength of 1.55 µm was prepared. A non-reflective film was formed on the polished face of the single crystal plate, to prepare a Faraday rotator. The thickness of the rotator was 410 µm, while the saturated magnetic field in a 1-mm square shape was 618 Oe. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 2-12

$Gd_2O_3$, $Yb_2O_3$, $Fe_2O_3$, $PtO_2$, $B_2O_3$, $Bi_2O_3$, and NaOH were charged in a crucible 4 made of Au, which was arranged in an electric furnace. Then, the molar ratio of Pt to Fe (Pt/Fe) was 0.006. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 μm was obtained. The grown single crystal film was compositionally analyzed by X-ray fluorescence analysis. The composition was $Bi_{1.000}Gd_{1.610}Yb_{0.390}Fe_{4.990}Pt_{0.010}O_{12}$, with no Na detected. Then, the composition was examined in detail by the ICP analysis. The Na content could be determined. Consequently, the chemical formula of the magnetic garnet single crystal was $(BiGdYb)_{2.995}Na_{0.005}(FePt)_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. The thickness of the rotator was 410 μm, while the saturated magnetic field in a 1-mm square shape was 618 Oe. 20 samples were taken out of the prepared Faraday rotator to evaluate the optical loss against the beam at a wavelength of 1.55 μm. The optical loss of the Faraday rotator was 0 to 0.01 dB, which was very small optical loss.

Comparative Example 2-1

$Gd_2O_3$, $Yb_2O_3$, $Fe_2O_3$, $B_2O_3$, $Bi_2O_3$, and NaOH were charged in a crucible 4 made of Au, which was arranged in an electric furnace. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 500 μm was obtained. The grown single crystal film was compositionally analyzed by X-ray fluorescence analysis. The composition was $Bi_{1.000}Gd_{1.610}Yb_{0.390}Fe_{5.000}O_{12}$, with no Na detected. Then, the composition was examined in detail by the ICP analysis. The Na content could be determined. Consequently, the chemical formula of the magnetic garnet single crystal was $(BiGdYb)_{2.998}Na_{0.002}Fe_{5.000}O_{12}$. By processing the grown single crystal film 12, a single crystal plate with a rotation angle of 45 deg toward the beam at a wavelength of 1.55 μm was prepared. A non-reflective film was formed on the polished face of the single crystal plate, to prepare a Faraday rotator. The thickness of the rotator was 410 μm, while the saturated magnetic field in a 1-mm square shape was 618 Oe. 20 samples were taken out of the prepared Faraday rotator to evaluate the optical loss against the beam at a wavelength of 1.55 μm. The optical loss of the Faraday rotator was 3.0 to 3.5 dB, which was very large optical loss.

Comparative Example 2-2

$Gd_2O_3$, $Yb_2O_3$, $Fe_2O_3$, $PtO_2$, $B_2O_3$, $Bi_2O_3$, and NaOH were charged in a crucible 4 made of Au, which was arranged in an electric furnace. Then, the molar ratio of Pt to Fe (Pt/Fe) was 0.100. By dissolving the materials in the crucible 4 by raising the furnace temperature to 950° C., a melt 8 was generated and agitated with an agitation device made of Au. Arranging the CaMgZr-substituted GGG substrate 10 onto a fixing device 2 made of Au and then charging the substrate into a furnace, the furnace temperature was lowered down to 850° C. and then, a single face of the substrate 10 was put in contact with the melt 8 to allow epitaxial growth for 40 hours. A magnetic garnet single crystal film of a film thickness of 365 μm and with a great number of crystal defects on the grown surface was obtained. The grown single crystal was compositionally analyzed by X-ray fluorescence analysis. The composition was $Bi_{0.950}Gd_{1.590}Yb_{0.380}Na_{0.080}Fe_{4.840}Pt_{0.160}O_{12}$. Because the thickness of the single crystal film was insufficient, no single crystal plate with a rotation angle of 45 deg toward the beam at a wavelength of 1.55 μm was prepared.

FIG. 3 collectively depicts the (M2+M3)/Fe molar ratios in the blend materials, the Na amount "β", the M2 amount "γ" and the M3 amount "δ" in the grown garnet single crystals, and the optical loss (dB) of the prepared Faraday rotators in the Examples and the Comparative Examples. As shown in FIG. 3, the Faraday rotators (Examples 2-1 through 2-12) using the magnetic garnet single crystals containing Na, M2 and M3 can have reduced optical loss compared with the Faraday rotator (Comparative Example 2-1) using the magnetic garnet single crystal never containing M2 and M3. In case that the Na amount "β" in the magnetic garnet single crystal is 0.1 or less and the amount "γ" of M2 comprising Ge and Si is 0.2 or less (M3 amount "δ"=0) (Examples 2-1 through 2-8), preferably in case that the Na amount "β" in the magnetic garnet single crystal is 0.05 or less and the M2 amount "γ" is 0.1 or less (M3 amount "δ"=0) (Examples 2-1 through 2-6 and Example 2-8), the resulting Faraday rotators can have extremely small optical loss.

Third Mode for Carrying out the Invention

A magnetic garnet single crystal and an optical element using the same in accordance with a third mode for carrying out the invention are described below with reference to FIG. 4. In this mode, Pb contained in conventional solvents is at least partially replaced with sodium (Na), to grow magnetic garnet single crystals from solutions containing Na. Compared with other oxides, many of substances containing Na and oxygen are dissolved at lower temperature. Thus, Na is effective as a solvent for growing magnetic garnet single crystals. For example, magnetic garnet single crystals grown in solvents containing sodium hydroxide (NaOH) are of excellent quality without any defects or cracks. By removing PbO from solvent materials and using a substance containing Na together with $Bi_2O_3$ and $B_2O_3$ as a solvent, a trace amount of Pb contained in conventional magnetic garnet single crystals can almost completely be removed.

It was shown however that the garnet single crystal grown in the solvent containing Na had very high optical absorption in a wavelength band region of 1300 to 1600 nm for use in optical communication. When a garnet single crystal with high optical absorption is processed to prepare an optical element such as Faraday rotator, disadvantageously, the optical loss (insertion loss) in the resulting optical element is elevated. So as to reduce the optical loss of an optical element from which Pb has preliminarily been removed almost completely, therefore, it is necessary to reduce the optical absorption of a garnet single crystal grown with solvents containing Na.

Herein, a Faraday rotator was prepared by processing a magnetic garnet single crystal ($(BiGdYb)_3Fe_5O_{12}$) grown in a solvent containing NaOH, $Bi_2O_3$ and $B_2O_3$ by the LPE process. The optical loss of the Faraday rotator to the beam at a wavelength of 1.55 µm was 3 dB. Another Faraday rotator was prepared by processing a magnetic garnet single crystal ($(BiGdYb)_3Fe_5O_{12}$) grown in a solvent containing Pb by the LPE process. The optical loss of the Faraday rotator to the beam at a wavelength of 1.55 µm was 0.05 dB or less. It was now shown that the optical loss of the Faraday rotator prepared by using the Na-containing solvent was extremely large compared with the optical loss of the Faraday rotator prepared by using the Pb-containing solvent. The composition of the magnetic garnet single crystal prepared by using the Na-containing solvent was examined by X-ray fluorescence analysis. Na at about 100 to 300 ppm was detected therein. The cation (positive ion) constituting Bi-substituted rare-earth iron garnet is essentially trivalent. When the Na cation of monovalence as the stable valence number enters in a magnetic garnet single crystal, the charge balance is deteriorated therein so that the resulting garnet single crystal becomes a semiconductor. This indicates the occurrence of optical absorption in the Na-containing garnet single crystal.

In this mode, at least one of tin oxide ($SnO_2$), rhodium oxide ($RhO_2$), ruthenium oxide ($RuO_2$), hafnium oxide ($HfO_2$), zirconium oxide ($ZrO_2$), vanadium oxide ($V_2O_5$), antimony oxide ($Sb_2O$,), niobium oxide ($Nb_2O_5$), tantalum oxide ($Ta_2O_5$), molybdenum oxide ($MoO_3$) and tungsten oxide ($WO_3$) was added together with Na to a blend material, to grow a garnet single crystal. The grown garnet single crystal was processed into a Faraday rotator to evaluate the optical loss. It was found that the optical loss was likely reduced. Tetravalent cations of Sn, Rh, Ru, Hf and Zr are stable in garnet; pentavalent cations of V, Sb, Nb and Ta are stable in garnet; and hexovalent cations of Mo and W are stable in garnet. These tetravalent, pentavalent or hexovalent cations entering in a magnetic garnet single crystal together with the cation of Na compensate the charge for well balanced charge, so that the resulting magnetic garnet single crystal becomes an insulant. It is suggested that the optical absorption of the magnetic garnet single crystal was reduced in such manner.

In the mode, various amounts of $SnO_2$ were added to a Na-containing blend material, to grow plural types of garnet single crystals. Using the molar ratio of Sn to Fe in the blend material (Sn/Fe molar ratio) as a parameter, the Sn/Fe molar ratio was preset at various values within a range of 0 to 0.02 by changing the amount of $SnO_2$. The grown garnet single crystals of plural types were individually processed into Faraday rotators, to evaluate the optical loss. Consequently, even a trace amount of $SnO_2$ added to the blend material greatly reduced the optical loss of the resulting Faraday rotators. It was demonstrated that the optical loss of a Faraday rotator prepared by using a blend material at 0.004 as the Sn/Fe molar ratio was as small as 0 to 0.01 dB. Even when the Sn/Fe molar ratio was elevated to more than 0.004, the optical loss of the resulting Faraday rotator was 0 to 0.01 dB, without any change.

The composition of the garnet single crystal grown from a blend material at 0.004 as the Sn/Fe molar ratio was analyzed by X-ray fluorescence analysis and ICP (inductively coupled plasma; high-frequency inductively coupled plasma) analysis. The chemical formula $(BiGdYb)_{2.996}Na_{0.004}Fe_{4.993}Sn_{0.007}O_{12}$ was obtained. Thus, the introduction of an element stable at its tetravalent state in garnet such as Sn into the magnetic garnet single crystal reduced the optical loss of the resulting Faraday rotator. It was found that particularly when the Sn amount "κ" in the magnetic garnet single crystal was adjusted to 0.007 (κ=0.007) in the chemical formula, the optical loss of the Faraday rotator could be made at minimum. Even when the Sn amount "κ" in the magnetic garnet single crystal was further elevated (κ>0.007), the optical loss of the Faraday rotator remained at the minimum.

It was shown that elements stable at tetravalent states in garnet, such as Rh, Ru, Hf and Zr like Sn when used in place of Sn could reduce the optical loss of the resulting Faraday rotator. Additionally, it was found that when the amount "κ" of these elements in the magnetic garnet single crystal was preset to 0.007 or more in the chemical formula (κ≧0.007), the optical loss of the resulting Faraday rotator could be reduced to minimum.

It was also shown that V, Sb, Nb, Ta and the like stable at their pentavalent states in garnet or W, Mo and the like stable at their hexovalent states in garnet, when used, could also reduce the optical loss of the resulting Faraday rotators as well. In case that these elements stable at their valence V or VI in garnet are used, conditions for making the optical loss of the resulting Faraday rotator minimal differed from those described above. As to V, Sb, Nb and Ta becoming pentavalent cations in garnet, when the amount "λ" of these elements was preset to 0.0035 or more in the chemical formula (2λ≧0.007), the optical loss of the resulting Faraday rotators could be made at minimum. As to W and Mo becoming hexovalent cations in garnet, when the amount "µ" of these elements was preset to 0.0023 or more in the chemical formula (3µ≧0.007), the optical loss of the resulting Faraday rotators could be made at minimum.

Furthermore, two or more of Sn, Rh, Ru, Hf, Zr, V, Sb, Nb, Ta, W and Mo when used in combination could reduce the optical loss of the resulting Faraday rotators in the same manner. When the amount "κ" of at least one element selected from Sn, Rh, Ru, Hf and Zr, the amount "λ" of at least one element selected from V, Sb, Nb and Ta and the amount "µ" of at least one element selected from W and Mo satisfy the relation of κ+λ+µ>0, the optical absorption of the magnetic garnet single crystals and the optical loss of the resulting Faraday rotators are reduced. Additionally when the κ, the λ and the µ satisfy the relation of κ+2λ+3µ≧0.007, the optical absorption of the magnetic garnet single crystals and the optical loss of the resulting Faraday rotators are more reduced.

When given amounts of Sn, Rh, Ru, Hf, Zr, V, Sb, Nb, Ta, W and Mo enter at a given amount or more in a garnet single crystal to lose charge balance, Na enters in the garnet single crystal in such a manner that the charge may be compensated. When a large amount of Fe is substituted with Sn, Rh, Ru, Hf, Zr, V, Sb, Nb, Ta, W and Mo, therefore, Na enters in a garnet single crystal to thereby compensate the charge. When the amounts of Sn, Rh, Ru, Hf, Zr, V, Sb, Nb, Ta, W and Mo in substitution in a magnetic garnet single crystal are more than 1.6, the Curies point is lowered down to around ambient temperature, which causes difficulty in using the resulting single crystal as a Faraday rotator. Thus, the upper limit of the amounts of Sn, Rh, Ru, Hf, Zr, V, Sb, Nb, Ta, W and Mo in substitution is 1.6 in the chemical formula (κ+λ+µ≦1.6).

When an element stable at a tetravalent state and an element stable at a monovalent state enter at a ratio of 2:1 in a garnet single crystal, the charge can be well balanced. When Sn, Rh, Ru, Hf and Zr which are stable at a tetravalent state enter just at 1.6 in the chemical formula in garnet, therefore, Na enters just at 0.8 in the chemical formula. When an element stable at a pentavalent state and an element stable at a monovalent state enter at a ratio of 1:1 in a garnet single crystal, the charge can be well balanced. When V, Sb, Nb and Ta which are stable at a pentavalent state enter just at 1.6 in the chemical formula in a garnet single crystal, therefore, Na enters just at 1.6 in the chemical formula. When an element stable at a hexovalent state and an element stable at a monovalent state enter at a ratio of 2:3 in a garnet single crystal, the charge can be well balanced. When W and Mo stable at their hexovalent states enter just at 1.6 in the chemical formula in a garnet single crystal, therefore, Na enters just at 2.4 in the chemical formula. In other words, the upper limit of Na contained in the magnetic garnet single crystal usable in Faraday rotators is 2.4 in the chemical-formula ($\beta \leq 2.4$).

In case of growing a magnetic garnet single crystal in a solvent containing Na, the solution can be retained at its supersaturation state stably, compared with a solvent never containing Na. Therefore, Bi up to about 2.0 in the chemical formula can enter stably in a garnet single crystal ($\alpha \leq 2.0$). So as to obtain a sufficient rotation coefficient (deg/μm) as a Faraday rotator, meanwhile, Bi at 0.5 or more in the chemical formula is required ($\alpha \geq 0.5$).

In this mode, furthermore, the following elements capable of stably forming a garnet single crystal singly or in combination with Fe are used as rare-earth elements to be contained in the magnetic garnet single crystal: yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

As described above, the magnetic garnet single crystal in the mode for carrying out the invention is represented by the chemical formula $Bi_\alpha Na_\beta M1_{3-\alpha-\beta} Fe_{5-\kappa-\lambda-\mu} M4_\kappa M5_\lambda M6_\mu O_{12}$ (M1 is at least one element selected from Y, La, Ce, Pr, Nd, Sm, Eu, Gd, Tb, Dy, Ho, Er, Tm, Yb and Lu; M4 is at least one element selected from Sn, Rh, Rh, Hf and Zr; M5 is at least one element selected from V, Sb, Nb and Ta; and M6 is at least one element selected from W and Mo, provided that $0.5 \leq \alpha \leq 2.0$, $0 < \beta \leq 2.4$, $0 < 3-\alpha-\beta < 2.5$, and $0 < \kappa + \lambda + \mu \leq 1.6$). According to this mode, a magnetic garnet single crystal from which Pb is preliminarily removed almost completely as well as an optical element using the same can be realized. According to this mode for carrying out the invention, the optical absorption of the magnetic garnet single crystal and the optical loss of the resulting optical element can be reduced.

The magnetic garnet single crystal and the optical element using the same in accordance with this mode are more specifically described below, using Examples and Comparative Examples.

EXAMPLE 3-1

$Gd_2O_3$, $Yb_2O_3$, $Fe_2O_3$, $SnO_2$, $B_2O_3$, $Bi_2O_3$, and NaOH were charged in a crucible made of gold (Au), which was arranged in an electric furnace. The Sn/Fe molar ratio then was 0.006. By dissolving the materials in the crucible by raising the furnace temperature to 950° C., a melt was generated and agitated with an agitation device made of Au. As a substrate for growing a magnetic garnet single crystal film thereon, a single crystal wafer prepared from an ingot of a garnet single crystal grown by the pulling method is used. In this Example, a CaMgZr-substituted GGG (gadolinium.gallium.garnet) single crystal substrate $((GdCa)_3(GaMgZr)_5 O_{12})$ is used as the substrate for growing the single crystal.

Arranging the CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.050}Fe_{4.990}Sn_{0.010}O_{12}$, with no Na detected. The composition was examined in detail by the ICP analysis. The Na content could be determined. Consequently, it was shown that the chemical formula of the magnetic garnet single crystal film was $(BiGdYb)_{2.995}Na_{0.005}(FeSn)_{5.000}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-2

$Gd_2O_3$, $Yb_2O_3$, $Fe_2O_3$, $SnO_2$, $B_2O_3$, $Bi_2O_3$, and NaOH were charged in a crucible made of Au, which was arranged in an electric furnace. The Sn/Fe molar ratio then was 0.004. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500} Fe_{4.993}Sn_{0.007}O_{12}$, with no Na detected. The composition was examined in detail by the ICP analysis. The Na content could be determined. Consequently, it was shown that the chemical formula of the magnetic garnet single crystal film was $(BiGdYb)_{2.996}Na_{0.004}(FeSn)_{5.000}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-3

$Gd_2O_3$, $Yb_2O_3$, $Fe_2O_3$, $SnO_2$, $B_2O_3$, $Bi_2O_3$, and NaOH were charged in a crucible made of Au, which was arranged in an electric furnace. The Sn/Fe molar ratio then was 0.008. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis, with Na detected. The composition was $Bi_{1.293}Gd_{1.200}Yb_{0.500}Na_{0.007}Fe_{4.987}Sn_{0.013}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-4

$Gd_2O_3$, $Yb_2O_3$, $Fe_2O_3$, $SnO_2$, $B_2O_3$, $Bi_2O_3$, and NaOH were charged in a crucible made of Au, which was arranged in an electric furnace. The Sn/Fe molar ratio then was 0.012. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis, with Na detected. The composition was $Bi_{1.290}Gd_{1.200}Yb_{0.005}Na_{0.010}Fe_{4.980}Sn_{0.020}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-5

$Gd_2O_3$, $Yb_2O_3$, $Fe_2O_3$, $SnO_2$, $B_2O_3$, $Bi_2O_3$, and NaOH were charged in a crucible made of Au, which was arranged in an electric furnace. The Sn/Fe molar ratio then was 0.020. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis, with Na detected. The composition was $Bi_{1.283}Gd_{1.200}Yb_{0.500}Na_{0.017}Fe_{4.967}Sn_{0.033}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-6

$Gd_2O_3$, $Yb_2O_3$, $Fe_2O_3$, $SnO_2$, $B_2O_3$, $Bi_2O_3$, and NaOH were charged in a crucible made of Au, which was arranged in an electric furnace. The Sn/Fe molar ratio then was 0.002. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{4.997}Sn_{0.003}O_{12}$, with no Na detected. The composition was examined in detail by the ICP analysis. The Na content could be determined. Consequently, it was shown that the chemical formula of the magnetic garnet single crystal film was $(BiGdYb)_{2.998}Na_{0.002}(FeSn)_{5.000}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0.2 to 0.25 dB.

EXAMPLE 3-7

$Gd_2O_3$, $Yb_2O_3$, $Fe_2O_3$, $SnO_2$, $B_2O_3$, $Bi_2O_3$, and NaOH were charged in a crucible made of Au, which was arranged in an electric furnace. The Sn/Fe molar ratio then was 0.003. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{4.994}Sn_{0.006}O_{12}$, with no Na detected. The composition was examined in detail by the ICP analysis. The Na content could be determined. Consequently, it was shown that the chemical formula of the magnetic garnet single crystal film was $(BiGdYb)_{2.997}Na_{0.003}(FeSn)_{5.000}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0.04 to 0.07 dB.

EXAMPLE 3-8

$Gd_2O_3$, $Yb_2O_3$, $Fe_2O_3$, $RhO_2$, $B_2O_3$, $Bi_2O_3$, and NaOH were charged in a crucible made of Au, which was arranged in an electric furnace. The Rh/Fe molar ratio then was 0.006. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{4.990}Rh_{0.010}O_{12}$, with no Na detected. The composition was examined in detail by the ICP analysis. The Na content could be determined. Consequently, it was shown that the chemical formula of the magnetic garnet single crystal film was $(BiGdYb)_{2.995}Na_{0.005}(FeRh)_{5.000}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-9

$Gd_2O_3$, $Yb_2O_3$, $Fe_2O_3$, $RuO_2$, $B_2O_3$, $Bi_2O_3$, and NaOH were charged in a crucible made of Au, which was arranged in an electric furnace. The Ru/Fe molar ratio then was 0.006. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{4.990}Ru_{0.010}O_{12}$, with no Na detected. The composition was examined in detail by the ICP analysis. The Na content could be determined. Consequently, it was shown that the chemical formula of the magnetic garnet single crystal film was $(BiGdYb)_{2.995}Na_{0.005}(FeRu)_{5.000}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-10

$Gd_2O_3$, $Yb_2O_3$, $Fe_2O_3$, $HfO_2$, $B_2O_3$, $Bi_2O_3$, and NaOH were charged in a crucible made of Au, which was arranged in an electric furnace. The Hf/Fe molar ratio then was 0.006. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{4.990}Hf_{0.010}O_{12}$, with no Na detected. The composition was examined in detail by the ICP analysis. The Na content could be determined. Consequently, it was shown that the chemical formula of the magnetic garnet single crystal film was $(BiGdYb)_{2.995}Na_{0.005}(FeHf)_{5.000}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-11

$Gd_2O_3$, $Yb_2O_3$, $Fe_2O_3$, $ZrO_2$, $B_2O_3$, $Bi_2O_3$, and NaOH were charged in a crucible made of Au, which was arranged in an electric furnace. The Zr/Fe molar ratio then was 0.006. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{4.990}Zr_{0.010}O_{12}$, with no Na detected. The composition was examined in detail by the ICP analysis. The Na content could be determined. Consequently, it was shown that the chemical formula of the magnetic garnet single crystal film was $(BiGdYb)_{2.995}Na_{0.005}(FeZr)_{5.000}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-12

$Gd_2O_3$, $Yb_2O_3$, $Fe_2O_3$, $V_2O_5$, $B_2O_3$, $Bi_2O_3$, and NaOH were charged in a crucible made of Au, which was arranged in an electric furnace. The V/Fe molar ratio then was 0.003. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with neither Na nor V detected. The composition was examined in detail by the ICP analysis. The contents of Na and V could be determined. Consequently, it was shown that the chemical formula of the magnetic garnet single crystal film was $(BiGdYb)_{2.995}Na_{0.005}Fe_{4.995}V_{0.005}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-13

$Gd_2O_3$, $Yb_2O_3$, $Fe_2O_3$, $Sb_2O_5$, $B_2O_3$, $Bi_2O_3$, and NaOH were charged in a crucible made of Au, which was arranged in an electric furnace. The Sb/Fe molar ratio then was 0.003. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with neither Na nor Sb detected. The composition was examined in detail by the ICP analysis. The contents of Na and Sb could be determined. Consequently, it was shown that the chemical formula of the magnetic garnet single crystal film was $(BiGdYb)_{2.995}Na_{0.005}Fe_{4.995}Sb_{0.005}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-14

$Gd_2O_3$, $Yb_2O_3$, $Fe_2O_3$, $Nb_2O_5$, $B_2O_3$, $Bi_2O_3$, and NaOH were charged in a crucible made of Au, which was arranged in an electric furnace. The Nb/Fe molar ratio then was 0.003. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with neither Na nor Nb detected. The composition was examined in detail by the ICP analysis. The contents of Na and Nb could be determined. Consequently, it was shown that the chemical formula of the magnetic garnet single crystal film was $(BiGdYb)_{2.995}Na_{0.005}Fe_{4.995}Nb_{0.005}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-15

$Gd_2O_3$, $Yb_2O_3$, $Fe_2O_3$, $Ta_2O_5$, $B_2O_3$, $Bi_2O_3$, and NaOH were charged in a crucible made of Au, which was arranged in an electric furnace. The Ta/Fe molar ratio then was 0.003. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with neither Na nor Ta detected. The composition was examined in detail by the ICP analysis. The contents of Na and Ta could be determined. Consequently, it was shown that the chemical formula of the magnetic garnet single crystal film was $(BiGdYb)_{2.995}Na_{0.005}Fe_{4.995}Ta_{0.005}O_{12}$. By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-16

$Gd_2O_3$, $Yb_2O_3$, $Fe_2O_3$, $WO_3$, $B_2O_3$, $Bi_2O_3$, and NaOH were charged in a crucible made of Au, which was arranged in an electric furnace. The W/Fe molar ratio then was 0.002. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with neither Na nor W detected. The composition was examined in detail by the ICP analysis. The contents of Na and W could be determined. Consequently, it was shown that the chemical formula of the magnetic garnet single crystal film was $(BiGdYb)_{2.995}Na_{0.005}Fe_{4.997}W_{0.003}O_{12}$, By processing the grown single crystal film, a single crystal plate with a rotation angle of 45 deg toward the beam at a wavelength of 1.55 μm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 μm. The optical loss of the Faraday rotator was 0 to 0.01 dB, which was very small optical loss.

EXAMPLE 3-17

$Gd_2O_3$, $Yb_2O_3$, $Fe_2O_3$, $MoO_3$, $B_2O_3$, $Bi_2O_3$, and NaOH were charged in a crucible made of Au, which was arranged in an electric furnace. The Mo/Fe molar ratio then was 0.002. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 µm was obtained. The grown single crystal film was compositionally analyzed by X-ray fluorescence analysis. The composition was $Bi_{1.300}Gd_{1.200}Yb_{0.500}Fe_{5.000}O_{12}$, with neither Na nor Mo detected. The composition was examined in detail by the ICP analysis. The contents of Na and Mo could be determined. Consequently, it was shown that the chemical formula of the magnetic garnet single crystal film was $(BiGdYb)_{2.995}Na_{0.005}Fe_{4.997}Mo_{0.003}O_{12}$. By processing the grown single crystal film, a single crystal plate with a rotation angle of 45 deg toward the beam at a wavelength of 1.55 µm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 µm. The optical loss of the Faraday rotator was 0 to 0.01 dB, which was very small optical loss.

Comparative Example 3-1

$Gd_2O_3$, $Yb_2O_3$, $Fe_2O_3$, $B_2O_3$, $Bi_2O_3$, and NaOH were charged in a crucible made of Au, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of 500 µm was obtained. The grown single crystal film was compositionally analyzed by X-ray fluorescence analysis. The composition was $Bi_{1.300}Gd_{1.200}Yb_{0.050}Fe_{5.000}O_{12}$, with no Na detected. The composition was examined in detail by the ICP analysis. The content of Na could be determined. Consequently, it was shown that the chemical formula of the magnetic garnet single crystal film was $(BiGdYb)_{2.998}Na_{0.002}Fe_{5.000}O_{12}$. By processing the grown single crystal film, a single crystal plate with a rotation angle of 45 deg toward the beam at a wavelength of 1.55 µm was prepared. A non-reflective film was formed on the polished surface of the single crystal plate, to prepare a Faraday rotator. 20 samples were taken out of the prepared Faraday rotator to evaluate the optical loss against the beam at a wavelength of 1.55 µm. The optical loss of the Faraday rotator was 3.0 to 3.5 dB, which was very large optical loss.

FIG. 4 collectively depicts the Na amount "$\beta$", the M4 amount "$\kappa$", the M5 amount "$\lambda$", the M6 amount "$\mu$", "$\kappa+\lambda+\mu$", "$\kappa+2\lambda+3\mu$" in the grown garnet single crystals, and the optical loss (dB) of the prepared Faraday rotators in the Examples and the Comparative Examples. As shown in FIG. 4, the magnetic garnet single crystals in the Examples contain Na and any of M4, M5 or M6 ($\kappa+\lambda+\mu>0$). The magnetic garnet single crystal in the Comparative Example contains Na but never contains any of M4, M5 and M6 ($\kappa+\lambda+\mu=0$). It is shown that the Faraday rotators using the magnetic garnet single crystals containing any one of M4, M5 and M6 in the Examples are at smaller optical loss than the optical loss of the Faraday rotator using the magnetic garnet single crystal in the Comparative Example. In case that the M4 amount "$\kappa$", the M5 amount "$\mu$", and the M6 amount "$\mu$" satisfy the relation of $\kappa+2\lambda+3\mu\geq0.007$ (Examples 3-1 through 3-5 and Examples 3-8 through 3-17), the resulting Faraday rotators are at very small loss, compared with a conventional Faraday rotator (for example with the optical loss of 0.05 dB or less) prepared by using a magnetic garnet single crystal grown in a solvent containing Pb.

What is claimed is:

1. A magnetic garnet single crystal represented by the chemical formula $Bi_\alpha Na_\beta M1_{3-\alpha-\beta}Fe_{5-\gamma}M2_\gamma O_{12}$ (M1 is at least one element selected from Y, La, Ce, Pr, Nd, Sm, Eu, Gd, Tb, Dy, Ho, Er, Tm, Yb and Lu; and M2 is at least one element selected from Si, Ge and Ti, provided that $0.5<\alpha\leq2.0$, $0<\beta\leq0.8$, $0.2\leq3-\alpha-\beta<2.5$, and $0<\gamma\leq1.6$).

2. A magnetic garnet single crystal according to claim 1, where the $\gamma$ is under the provision of $0.007\leq\gamma\leq1.6$.

3. An optical element prepared by using a magnetic garnet single crystal according to claim 1.

4. A method for producing a magnetic garnet single crystal comprising preparing a melt from a material containing Na, Fe, M1 and M2 (M1 is at least one element selected from Y, La, Ce, Pr, Nd, Sm, Eu, Gd, Tb, Dy, Ho, Er, Tm, Yb and Lu, while M2 is at least one element selected from Si, Ge and Ti), and growing the magnetic garnet single crystal using the melt.

5. A method for producing a magnetic garnet single crystal according to claim 4, where a molar ratio of the M2 to Fe in the material is 0.004 or more.

6. A magnetic garnet single crystal according to claim 1, where the $\beta$ and the $\gamma$ are under the provisions of $0<\beta\leq0.1$, and $0<\gamma\leq0.2$.

7. A magnetic garnet single crystal according to claim 6, where the $\beta$ and the $\gamma$ are under the provisions of $0<\beta\leq0.05$ and $0<\gamma\leq0.1$.

8. A magnetic garnet single crystal according to claim 6, where the M2 is one or more elements including at least Si.

9. A magnetic garnet single crystal represented by the chemical formula $Bi_\alpha Na_\beta M1_{3-\alpha-\beta}Fe_{5-\gamma-\delta}M2_\gamma M3_\delta O_{12}$ (M1 is at least one element selected from Y, La, Ce, Pr, Nd, Sm, Eu, Gd, Tb, Dy, Ho, Er, Tm, Yb and Lu; M2 is at least one element selected from Si, Ge and Ti; and M3 is Pt, provided that $0.5<\alpha\leq2.0$, $0<\beta\leq0.8$, $0.2\leq3-\alpha-\beta<2.5$, $0<\gamma+\delta\leq1.6$, $0\leq\gamma<1.6$, and $0<\delta<0.16$).

10. A Faraday rotator prepared from a magnetic garnet single crystal according to claim 1.

11. A Faraday rotator prepared from a magnetic garnet single crystal according to claim 9.

12. A magnetic garnet single crystal represented by the chemical formula $Bi_\alpha Na_\beta M1_{3-\alpha-\beta}Fe_{5-\kappa-\lambda-\mu}M4_\kappa M5_\lambda M6_\mu O_{12}$ (M1 is at least one element selected from Y, La, Ce, Pr, Nd, Sm, Eu, Gd, Tb, Dy, Ho, Er, Tm, Yb and Lu; M4 is at least one element selected from Sn, Rh, Ru, Hf and Zr; M5 is at least one element selected from V, Sb, Nb and Ta; and M6 is at least one element selected from W and Mo, provided that $0.5\leq\alpha\leq2.0$, $0<\beta\leq2.4$, $0<3-\alpha-\beta<2.5$, and $0<\kappa+\lambda+\mu\leq1.6$).

13. A magnetic garnet single crystal according to claim 12, where the $\kappa$, the $\lambda$ and the $\mu$ satisfy the relation of $\kappa+2\lambda+3\mu\geq0.007$.

14. An optical element prepared by using a magnetic garnet single crystal according to claim 12.

* * * * *